US012630419B2

(12) United States Patent
Abbasi Gavarti et al.

(10) Patent No.: US 12,630,419 B2
(45) Date of Patent: May 19, 2026

(54) PRODUCTION METHOD FOR A MICROMECHANICAL SENSOR APPARATUS, AND CORRESPONDING MICROMECHANICAL SENSOR APPARATUS

(71) Applicant: Robert Bosch GmbH, Stuttgart (DE)

(72) Inventors: Mohammad Abbasi Gavarti, Monza (IT); Alexander Schoenhals, Reutlingen (DE); Andreas Menzel, Reutlingen (DE); Joachim Kreutzer, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 551 days.

(21) Appl. No.: 18/323,223

(22) Filed: May 24, 2023

(65) Prior Publication Data

US 2023/0406697 A1     Dec. 21, 2023

(30) Foreign Application Priority Data

Jun. 8, 2022     (DE) ..................... 10 2022 205 829.1

(51) Int. Cl.
B81C 1/00                (2006.01)
(52) U.S. Cl.
CPC .. B81C 1/00238 (2013.01); *B81B 2201/0264* (2013.01); *B81C 2203/0109* (2013.01); *B81C 2203/0792* (2013.01)
(58) Field of Classification Search
None
See application file for complete search history.

(56) References Cited

U.S. PATENT DOCUMENTS

| | | | |
|---|---|---|---|
| 7,250,353 B2 | 7/2007 | Nasiri et al. | |
| 7,442,570 B2 | 10/2008 | Nasiri et al. | |
| 9,159,587 B2 | 10/2015 | Canale et al. | |
| 2012/0049299 A1 | 3/2012 | Chou | |
| 2012/0235251 A1 | 9/2012 | Daneman et al. | |

(Continued)

FOREIGN PATENT DOCUMENTS

| | | | | |
|---|---|---|---|---|
| CN | 110476047 A | * | 11/2019 | ....... B29C 45/14311 |
| CN | 108473304 B | * | 5/2023 | ......... B81C 1/00269 |

(Continued)

*Primary Examiner* — Michael Lebentritt
(74) *Attorney, Agent, or Firm* — NORTON ROSE FULBRIGHT US LLP

(57)     ABSTRACT

A production method for a micromechanical sensor apparatus. The method includes: providing a bonded wafer stack comprising an ASIC wafer and a MEMS wafer, the ASIC wafer including ASIC switching devices and the MEMS wafer including MEMS sensor devices, an ASIC switching device and a corresponding MEMS sensor device are arranged one above the other such that they form a respective micromechanical sensor apparatus in the bonded wafer stack; providing a first packaging wafer having first front and rear faces; in the first rear face, the first packaging wafer has blind holes assigned to corresponding sensor detection regions of a respective MEMS sensor device; bonding the first rear face to the wafer stack such that the blind holes are each in fluid connection with the corresponding sensor detection region; backthinning, on the first front face, the first packaging wafer bonded to the wafer stack to expose the blind holes.

15 Claims, 8 Drawing Sheets

(56) References Cited

U.S. PATENT DOCUMENTS

| | | | |
|---|---|---|---|
| 2013/0001710 A1 | 1/2013 | Daneman et al. | |
| 2013/0161702 A1* | 6/2013 | Chen ................... | B81C 1/00246 |
| | | | 257/E27.006 |
| 2016/0146850 A1* | 5/2016 | Reinmuth ............. | G01P 15/125 |
| | | | 73/514.32 |
| 2016/0152466 A1* | 6/2016 | Gonska ............... | B81C 1/00238 |
| | | | 257/48 |
| 2016/0347609 A1* | 12/2016 | Yu ........................ | B81C 1/00238 |
| 2018/0111823 A1* | 4/2018 | Nunan .............. | H01L 21/76898 |
| 2020/0131028 A1* | 4/2020 | Cheng ................. | B81C 1/00238 |
| 2024/0182298 A1* | 6/2024 | Classen .............. | B81C 1/00325 |
| 2024/0400374 A1* | 12/2024 | Fujita .................. | G01P 15/0802 |

FOREIGN PATENT DOCUMENTS

| | | | | | |
|---|---|---|---|---|---|
| CN | 118790952 A | * | 10/2024 | .......... | G01C 25/005 |
| CN | 118851086 A | * | 10/2024 | .............. | G01P 15/02 |
| DE | 102010007605 A1 | | 8/2011 | | |
| DE | 102005040789 B4 | | 12/2014 | | |
| DE | 102014212314 A1 | * | 12/2015 | .......... | B81B 3/0051 |
| DE | 102014226436 A1 | | 6/2016 | | |
| DE | 102016216207 A1 | | 3/2018 | | |
| DE | 102016223203 A1 | | 5/2018 | | |
| DE | 102018125378 B3 | | 11/2019 | | |
| WO | WO-0177009 A1 | * | 10/2001 | ......... | B81C 1/00333 |

* cited by examiner

Fig. 1A
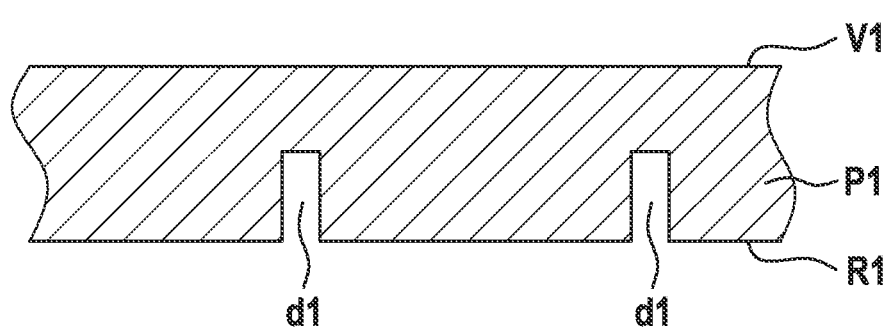
Fig. 1B
Fig. 1C
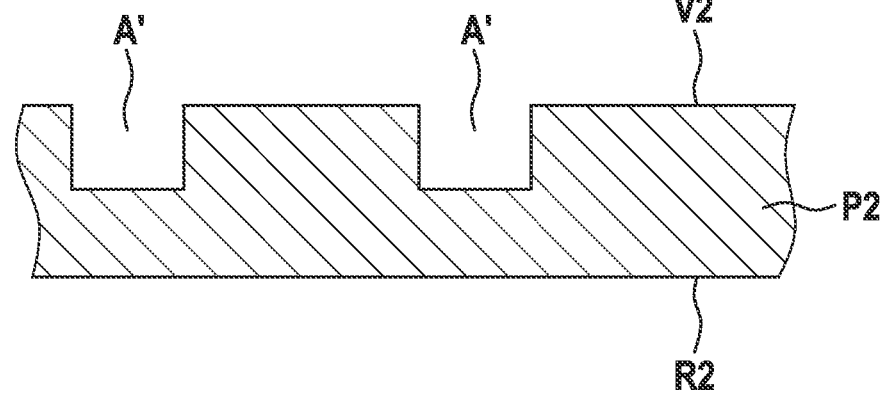

Fig. 6I
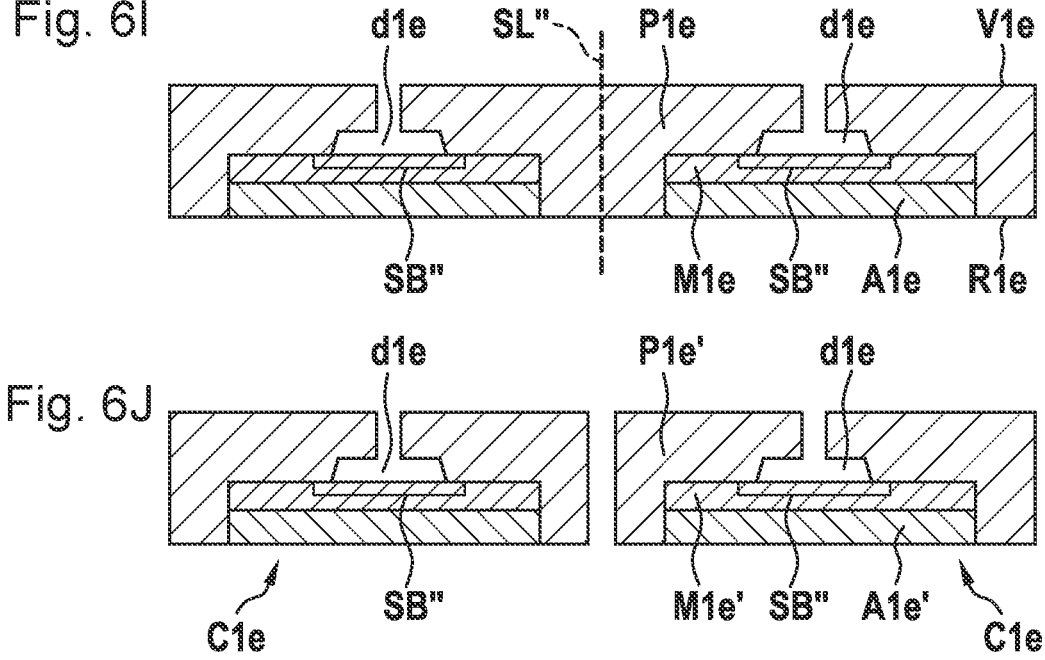
Fig. 6J
Fig. 7
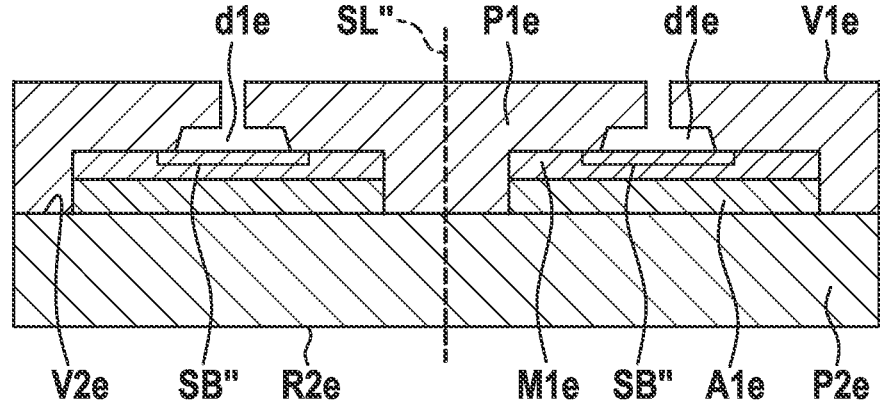

PRODUCTION METHOD FOR A MICROMECHANICAL SENSOR APPARATUS, AND CORRESPONDING MICROMECHANICAL SENSOR APPARATUS

CROSS REFERENCE

The present application claims the benefit under 35 U.S.C. § 119 of German Patent Application No. DE 10 2022 205 829.1 filed on Jun. 8, 2022, which is expressly incorporated herein by reference in its entirety.

FIELD

The present invention relates to a production method for a micromechanical sensor apparatus and to a corresponding micromechanical sensor apparatus.

BACKGROUND INFORMATION

Although any micromechanical components can be used, the present invention and underlying problem are explained with reference to silicon-based micromechanical pressure sensor apparatuses.

Micromechanical sensor apparatuses for consumer electronics, e.g., a silicon-based micromechanical pressure sensor device comprising an ASIC chip and a MEMS chip, are usually mounted on a substrate, e.g., an LGA or ceramic substrate, and protected, for example, by a cap and/or gel. This involves the use of different materials having different coefficients of thermal expansion and moisture absorption capacities. This renders such micromechanical pressure sensor apparatuses susceptible to environmental properties, such as temperature and moisture.

Methods of so-called vertical integration or hybrid integration or 3D integration are available, in which at least one MEMS and one evaluation ASIC wafer are mechanically and electrically connected to one another by means of wafer bonding methods, for example, as described in U.S. Pat. Nos. 7,250,353 B2 and 7,442,570 B2. Particularly attractive are these vertical integration methods in combination with silicon vias and flip-chip technologies, whereby the external contacting can take place as a "bare die module" or "chip scale package," i.e., without plastic packaging, as described, for example, in U.S. Patent Application Publication Nos. US 2012/0049299 A1 and US 2012/0235251 A1. However, since silicon is not electrically insulating, the electrically conductive vertical contact must be electrically insulated from the silicon by suitable measures. This means additional process effort.

U.S. Patent Application Publication No. US 2013/0001710 A1 describes a method and a system for forming a MEMS sensor apparatus, wherein a handling wafer is bonded to a MEMS wafer by means of a dielectric layer. After structuring the MEMS wafer to form the micromechanical sensor apparatus, a CMOS wafer is bonded to the MEMS wafer with the sensor apparatus. At the end of the process, the handling wafer may be further processed by etching or backgrinding, if necessary.

U.S. Pat. No. 9,159,587 B2 describes glass wafers for semiconductor processes and corresponding production methods.

German Patent No. DE 10 2018 125 378 B3 describes anodic bonding of a glass substrate with contact feedthroughs to a silicon substrate.

German Patent No. DE 10 2005 040 789 B4 describes a micromechanical component with a cap wafer consisting of at least a first silicon substrate and a thin glass substrate, with a functional wafer consisting of at least a second silicon substrate, wherein at least one electrical contact surface is arranged on the functional wafer. The cap wafer is connected with the glass substrate to the functional wafer by anodic bonding.

SUMMARY

The present invention provides a production method for a micromechanical sensor apparatus and a corresponding micromechanical sensor apparatus.

Preferred developments of the present invention are disclosed herein.

An underlying feature of the present invention is that a packaging wafer made of a glass material or a glass ceramic material or a ceramic material is used to package the micromechanical sensor apparatus, wherein pre-structuring and backthinning of the packaging wafer take place in order to create fluid access to the environment. Fluid access here does not necessarily include liquids but can also, additionally or exclusively, comprise gases. The production of the micromechanical sensor apparatus takes place entirely at the wafer level, which keeps production costs low, increases robustness and allows further miniaturization. There is no need for further packaging, which dramatically reduces the number of components.

According to a preferred development of the present invention, a second packaging wafer made of a glass material or a glass ceramic material or a ceramic material having a second front face and a second rear face is provided, and the second front face of the second packaging wafer is bonded to the wafer stack on the side opposite to the first packaging wafer. This allows a stable double-sided packaging to be produced.

According to another preferred development of the present invention, the first packaging wafer is bonded to the ASIC wafer, wherein the ASIC wafer has a plurality of through-holes, which are in fluid connection with the respective sensor detection region of the associated micromechanical sensor apparatus. This makes it possible to form a fluid connection with the outside through the ASIC wafer through the through-holes and the exposed blind holes.

According to another preferred development of the present invention, the MEMS wafer has a plurality of continuous first recesses, which are respectively adjacent to a first electrical contact of the ASIC wafer, wherein in the second front face, the second packaging wafer has a corresponding plurality of discontinuous second recesses, which are bonded to the first recesses, wherein backthinning of the second packaging wafer bonded to the wafer stack takes place on the second rear face in order to expose the first and second recesses on the second rear face so that the electrical contacts are exposed toward the outside and each form an external electrical connection region of the associated micromechanical sensor apparatus. This makes it possible to form bonding connections on the rear face of the ASIC wafer.

According to another preferred development of the present invention, the first packaging wafer is bonded to the MEMS wafer, wherein the MEMS wafer has a plurality of continuous third recesses, which are respectively adjacent to a second electrical contact in the ASIC wafer, wherein in the first front face, the first packaging wafer has a corresponding plurality of discontinuous fourth recesses, which are bonded to the third recesses, wherein during backthinning of the first packaging wafer bonded to the wafer stack, the third and fourth recesses are exposed on the first front face so that the electrical contacts are exposed toward the outside and each form an external electrical connection region of the associated micromechanical sensor apparatus. This makes it possible to form bonding connections on the front face of the ASIC wafer.

According to another preferred development of the present invention, the wafer stack has trenches, which at least partially surround the micromechanical sensor apparatuses at the wafer level at a lateral periphery and which extend completely through the MEMS wafer and partially through the ASIC wafer, wherein the blind holes are provided on the first rear face of the first packaging wafer in a respective lowered region of the first rear face, wherein the lowered regions are designed to enclose the lateral periphery of the micromechanical sensor apparatuses in the bonded state within the trenches. This makes it possible to extend the packaging to the lateral periphery.

According to another preferred development of the present invention, the bonding of the first packaging wafer and/or the bonding of the second packaging wafer are carried out by anodic bonding, in particular at about 300° C. In such a low-temperature process, disruptive influences on the MEMS and ASIC wafers can be avoided.

According to another preferred development of the present invention, the material of the first packaging wafer and/or the material of the second packaging wafer is pyrex glass or low-temperature co-fired ceramic material (LTCC). These materials are particularly well adapted to the properties of MEMS and ASIC wafers.

According to another preferred development of the present invention, the first packaging wafer and/or the second packaging wafer comprise one or more vias for electrically contacting the micromechanical sensor apparatuses. This enables simple electrical contacting.

BRIEF DESCRIPTION OF THE DRAWINGS

Further features and advantages of the present invention are explained below with reference to figures using example embodiments.

FIGS. 1A-1F show schematic cross-sectional views for explaining a production method for a micromechanical sensor apparatus according to a first example embodiment of the present invention.

FIGS. 6A-6J show schematic cross-sectional views for explaining a production method for a micromechanical sensor apparatus according to a sixth example embodiment of the present invention.

FIG. 7 shows a schematic cross-sectional view for explaining a micromechanical sensor apparatus according to a seventh example embodiment of the present invention.

DETAILED DESCRIPTION OF EXAMPLE EMBODIMENTS

In the figures, identical reference signs denote identical or functionally identical elements.

FIGS. 1A-1F show schematic cross-sectional views for explaining a production method for a micromechanical sensor apparatus according to a first example embodiment of the present invention.

According to FIG. 1A, a first packaging wafer P1 is first provided from a glass material or a glass ceramic material or a ceramic material, in the present example pyrex glass, and has a first front face V1 and a first rear face R1. As a result of a conventional pre-structuring process, the first packaging wafer P1 has, in the first rear face R1, a plurality of blind holes d1, which are each assigned to a corresponding sensor detection region SB of an associated MEMS sensor device, as explained below. The term "blind holes" herein is understood to mean depressions of any shape, which depressions may typically be perpendicular bores in the packaging wafer the depth of which is less than the packaging wafer thickness. This also includes other drilling directions, other geometries and also bores through the entire packaging wafer.

According to FIG. 1B, a bonded wafer stack WS is provided, which is formed from an ASIC wafer A1 and a MEMS wafer M1 bonded thereto, wherein both the ASIC wafer A1 and the MEMS wafer M1 bonded thereto are silicon wafers in the present example.

The ASIC wafer A1 has a plurality of ASIC switching devices (not shown in detail) and the MEMS wafer M1 has a plurality of MEMS sensor devices. An ASIC switching device and a corresponding MEMS sensor device are in each case arranged one above the other such that they form a respective micromechanical sensor apparatus in the bonded wafer stack. In the present example, the MEMS sensor device is a MEMS pressure sensor device and comprises a membrane region as the sensor detection region SB, in which, for example, piezo-resistive elements for pressure detection are arranged.

The ASIC wafer A1 has a plurality of cup-shaped, widening through-holes Z, which are in fluid connection with the respective sensor detection region SB of the associated micromechanical sensor apparatus and which later correspond to the blind holes d1 or are arranged accordingly in relation thereto.

Furthermore, the ASIC wafer A1 comprises a plurality of vias K, K'. The MEMS wafer M1 has a plurality of continuous first recesses A, in which a respective via K of the ASIC wafer A1 ends.

According to FIG. 1C, a second packaging wafer P2 is provided from a glass material or a glass ceramic material or a ceramic material, in the present example likewise pyrex glass, and has a second front face V2 and a second rear face R2. The second packaging wafer P2 is pre-structured on the second front face V2 and has a plurality of discontinuous second recesses A' there, which are respectively assigned to the first recesses A in the MEMS wafer M1 or arranged accordingly.

Figure 1D:
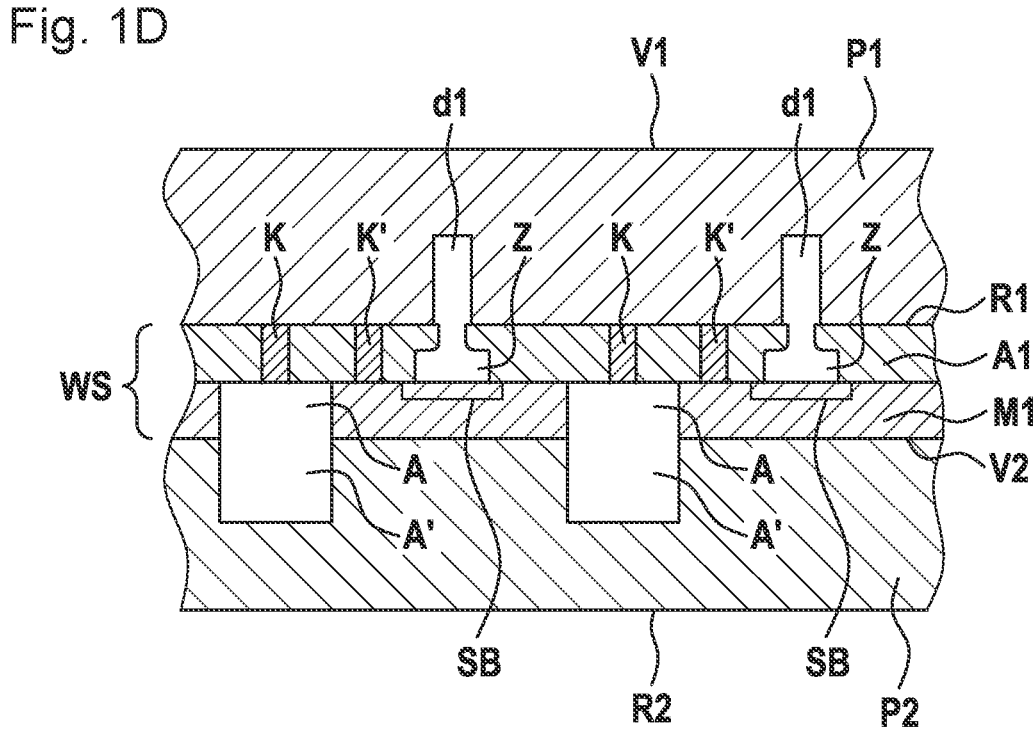

In a subsequent process step according to FIG. 1D, the first rear face R1 of the first packaging wafer P1 is bonded to the ASIC wafer A1 such that the blind holes d1 are each in fluid connection with the corresponding sensor detection region SB of the associated MEMS sensor device through the respective through-hole Z.

At the same time, the second front face V2 of the second packaging wafer P2 is bonded, on the side opposite the first packaging wafer P1, to the wafer stack WS, to the MEMS wafer M1. This is done such that the second recesses A' are respectively bonded to a corresponding first recess A of the MEMS wafer M1. In other words, the first recesses A and the second recesses A' now form contiguous recesses.

In the present example, the bonding of the first packaging wafer P1 and of the second packaging wafer P2 takes place in an anodic bonding process at about 300° C.

Figure 1E:
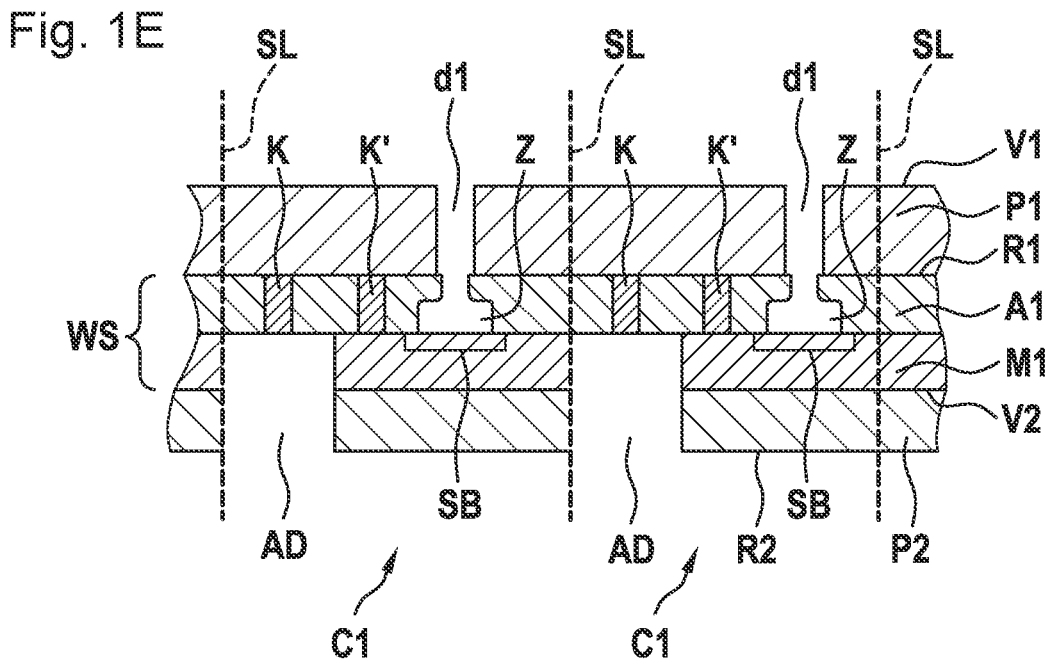

As shown in FIG. 1E, the first packaging wafer P1, which is bonded to the wafer stack WS, is now backthinned on the first front face V1 in order to expose the blind holes d1 in the first front face V1 so that the sensor detection regions SB of the MEMS sensor devices in the bonded wafer stack are in fluid connection with the outside through the exposed blind holes d1.

Simultaneously or subsequently, the second packaging wafer P2 bonded to the wafer stack WS is backthinned on the second rear face R2 in order to expose the first recesses A and the adjoining second recesses A' on the second rear face R2 as continuous recesses AD so that the vias K are exposed toward the second rear face R2 and each form an external electrical connection region of the ASIC wafer A1 of the associated micromechanical sensor apparatus.

Reference sign SL in FIG. 1E denotes separation lines, e.g., saw lines, along which the micromechanical sensor apparatuses in the bonded wafer stack are subsequently separated into a plurality of sensor chip stacks C1 with a respective micromechanical sensor apparatus. The saw lines SL in the bonded wafer stack are adjacent to the continuous recess AD.

Figure 1F:
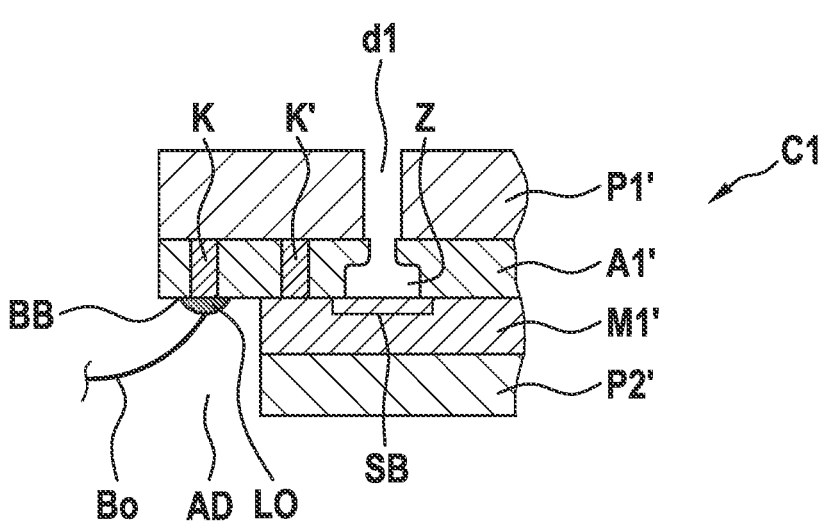

The result of the separation is shown in FIG. 1F. Each sensor chip stack C1 comprises a MEMS chip M1', an ASIC chip A1' bonded thereto, a first packaging chip P1' bonded to the ASIC chip A1', and a second packaging chip P2' bonded to the MEMS chip M1'.

As can be furthermore seen in FIG. 1F, the separation takes place such that the continuous recess AD is arranged in the shape of steps on the chip edge and therefore forms a lateral free space. A soldering region LO can thus be applied to the via K and a bond wire BO can be bonded thereto in order to thus form an electrical contact BB of the ASIC chip A1' of the sensor chip stack C1.

The sensor chip stack C1 can thus be packaged robustly and thermally stably by means of the packaging chips P1', P2' and, accordingly, be used further or mounted as required.

Figure 2A:
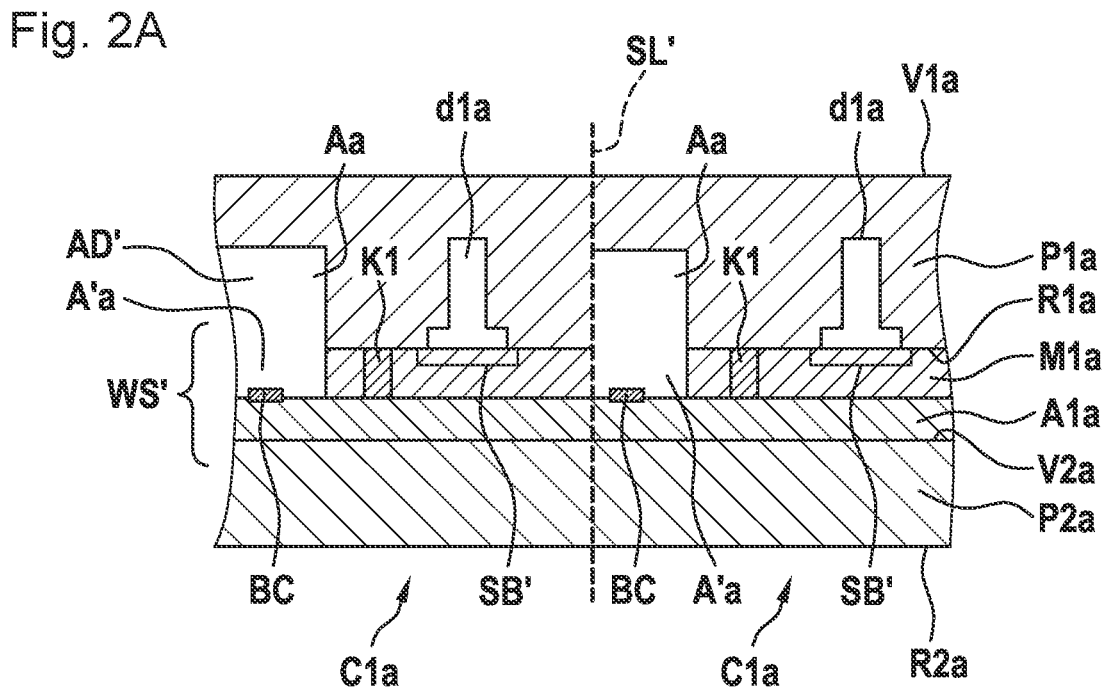
FIGS. 2A and 2B show schematic cross-sectional views for explaining a production method for a micromechanical sensor apparatus according to a second example embodiment of the present invention.
Figure 2B:
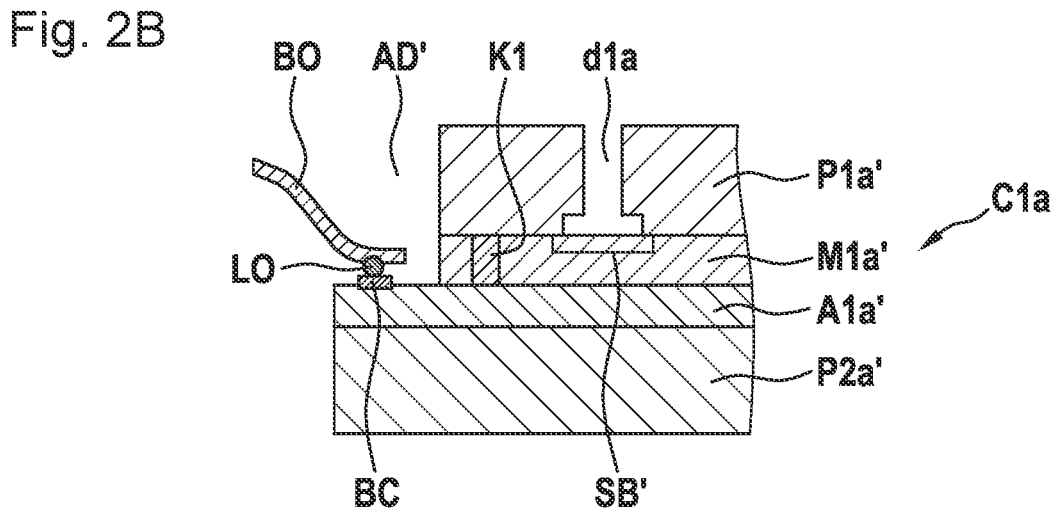

FIGS. 2A and 2B show schematic cross-sectional views for explaining a production method for a micromechanical sensor device according to a second embodiment of the present invention.

The process state according to FIG. 2A corresponds to the process state according to FIG. 1D. A MEMS wafer M1a made of silicon and an ASIC wafer A1a made of silicon are bonded to one another to form a wafer stack WS'. Again, the ASIC wafer A1a comprises a plurality of ASIC switching devices and the MEMS wafer M1a comprises a plurality of MEMS sensor devices, wherein an ASIC switching device and a corresponding MEMS sensor device are in each case bonded one above the other such that they form a respective micromechanical sensor apparatus in the bonded wafer stack. The MEMS sensor devices are likewise, by way of example, MEMS pressure sensor devices comprising a corresponding sensor detection region SB'. Vias K1 are provided in the MEMS wafer M1a, and electrical contacts BC of the ASIC wafer A1a are provided in first continuous recesses A'a of the MEMS wafer M1a.

A first packaging wafer P1a made of a glass material or a glass ceramic material or a ceramic material, here likewise pyrex glass, and having a first front face V1a and a first rear face R1a is bonded to the MEMS wafer M1a.

The first packaging wafer P1a has a plurality of blind holes d1a, which widen toward the first rear face R1a in a cup shape. Furthermore, the MEMS wafer M1a has a plurality of discontinuous second recesses Aa, which are adjacent to corresponding continuous first recesses A'a of the MEMS wafer M1a. In the second recesses A'a, the electrical contacts BC of the ASIC wafer A1a are exposed on the upper side of the ASIC wafer A1a.

A second packaging wafer P2a having a second front face V2a and a second rear face R2a is bonded to the ASIC wafer A1a oppositely to the MEMS wafer M1a. The second packaging wafer P2a also consists of a glass material or a glass ceramic material or a ceramic material. The second packaging wafer P2a is not pre-structured in this example.

In this second embodiment, the first packaging wafer P1a, which is bonded to the wafer stack WS', is backthinned on the first front face V1a in order to expose the blind holes d1a and the first recesses Aa on the first front face VIA so that the electrical contacts BC are exposed toward the outside and the sensor detection regions SB' are exposed toward the outside through the blind holes d1a, and so that the continuous recesses AD', which are formed from the first and second recesses A'a, Aa, are exposed toward the outside.

As in the first embodiment, the micromechanical sensor apparatuses in the bonded wafer stack are separated into a plurality of sensor chip stacks C1a with a respective micromechanical sensor apparatus along respective saw lines SL', which are adjacent to the continuous recesses AD'.

The result of the separation is shown in FIG. 2B. Each sensor chip stack C1a comprises an ASIC chip A1a', a MEMS chip M1a' bonded thereto, a first packaging chip P1a' bonded to the MEMS chip M1a', and a second packaging chip P2a' bonded to the ASIC chip A1a'.

According to FIG. 2B, separation thus takes place such that the continuous recesses AD' in the chip stack are provided in the shape of steps on the chip edge. In this embodiment as well, the electrical contacts BC of the ASIC chip A1a' can be connected to a respective bond wire BO by means of solder balls LO.

Figure 3:
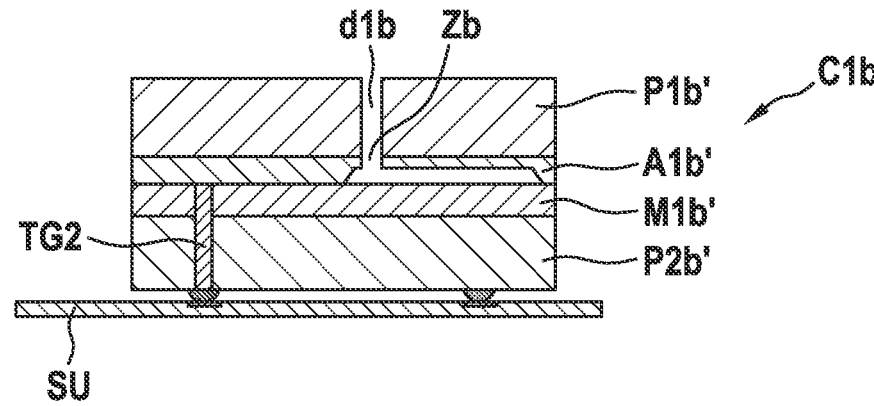
FIG. 3 shows a schematic cross-sectional view for explaining a micromechanical sensor apparatus according to a third example embodiment of the present invention.

FIG. 3 shows a schematic cross-sectional view for explaining a micromechanical sensor apparatus according to a third embodiment of the present invention.

In the third embodiment, reference sign C1b denotes a sensor chip stack comprising an ASIC chip Alb', a MEMS chip M1b', a first packaging chip P1b' bonded to the ASIC chip A1B', and a second packaging chip P2b' bonded to the MEMS chip M1b', wherein the packaging chips P1b', P2b' are again formed from pyrex glass.

The ASIC chip Alb' has a through-hole Zb, which adjoins a widened region and under which a sensor detection region (not shown) of the MEMS chip M1b' is exposed, which region is in fluid connection with the outside through the through-hole Zb and the exposed blind hole d1b of the first packaging chip P1b'. Furthermore, both the MEMS chip M1b' and the second packaging chip P2b' have a via TG2. The second packaging chip P2b' is soldered onto a carrier substrate SU, wherein the via TG2 terminates in a soldering region and thus serves as an external connection of the micromechanical sensor apparatus.

Figure 4:
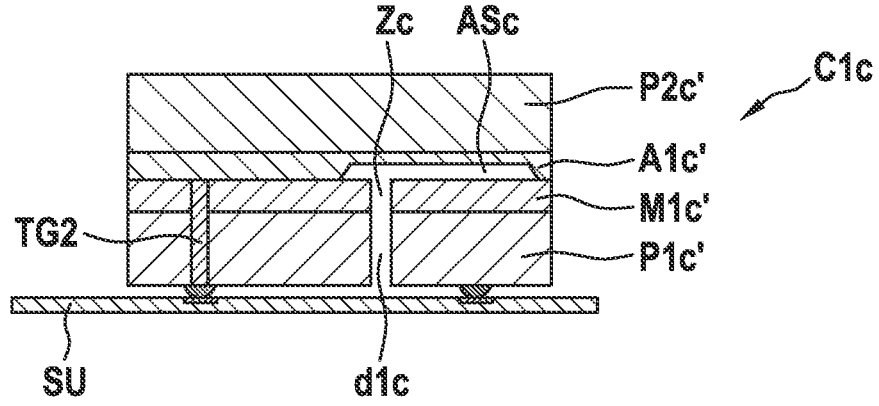
FIG. 4 shows a schematic cross-sectional view for explaining a micromechanical sensor apparatus according to a fourth example embodiment of the present invention.

FIG. 4 shows a schematic cross-sectional view for explaining a micromechanical sensor apparatus according to a fourth embodiment of the present invention.

In the fourth embodiment, reference sign C1c denotes a sensor chip stack comprising an ASIC chip A1c', a MEMS chip M1c', a first packaging chip P2b' bonded to the MEMS chip M1c', and a second packaging chip Plc' bonded to the ASIC chip A1c', wherein the packaging chips Plc', P2c' are again formed from pyrex glass.

The fourth embodiment differs from the third embodiment in that the ASIC chip A1c' has a recess ASc, which exposes the sensor detection region (not shown) of the MEMS chip M1c' and which is in fluid connection with the outside through a through-hole Zc in the MEMS chip M1c' and an exposed blind hole d1c in the first packaging chip Plc'.

Again, the first packaging chip Plc' and the MEMS chip M1c' comprise a via TG2, wherein the sensor chip stack C1c is again soldered onto a carrier substrate SU, and wherein the via TG2 terminates in a soldering region and thus serves as an external connection of the micromechanical sensor apparatus.

Figure 5:
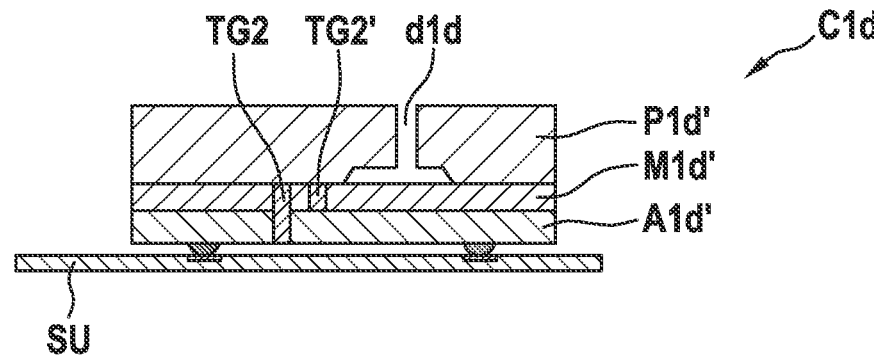
FIG. 5 shows a schematic cross-sectional view for explaining a micromechanical sensor apparatus according to a fifth example embodiment of the present invention.

FIG. 5 shows a schematic cross-sectional view for explaining a micromechanical sensor apparatus according to a fifth embodiment of the present invention.

In the fifth embodiment, reference sign C1d denotes a sensor chip stack comprising an ASIC chip A1d', a MEMS chip M1d' and a first packaging chip P1d' bonded to the MEMS chip M1d', wherein the first packaging chip P1d' is again formed from pyrex glass.

In the fifth embodiment, the MEMS chip M1d' comprises a via TG', which extends to the ASIC chip A1d', and the MEMS chip M1d' and the ASIC chip A1d' comprise vias TG2, which extend through both chips A1d', M1d'.

Again, the sensor chip stack C1d is soldered onto a carrier substrate SU. The sensor detection region (not shown) of the MEMS chip M1d' is in fluid connection with the outside through an exposed blind hole did of the first packaging chip P1d'.

FIGS. 6A-6J show schematic cross-sectional views for explaining a production method for a micromechanical sensor device according to a sixth embodiment of the present invention.

Figure 6A:
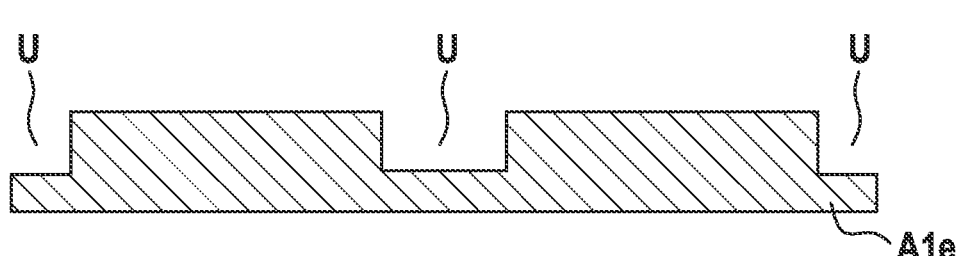

According to FIG. 6A, an ASIC wafer A1e with a plurality of ASIC switching devices (not shown) is first provided, wherein the ASIC switching devices are laterally surrounded by discontinuous circumferential trenches U. This can be achieved by a corresponding etching process.

Figure 6B:
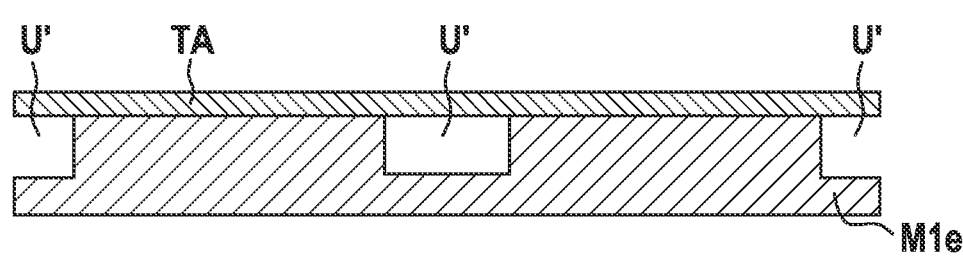

According to FIG. 6B, a MEMS wafer M1e is provided, which comprises a plurality of MEMS sensor devices (not shown), in this case likewise MEMS pressure sensor devices, which are likewise laterally surrounded by discontinuous circumferential trenches U'. The circumferential trenches U correspond to the circumferential trenches U' in terms of the orientation on the wafer.

Figure 6C:
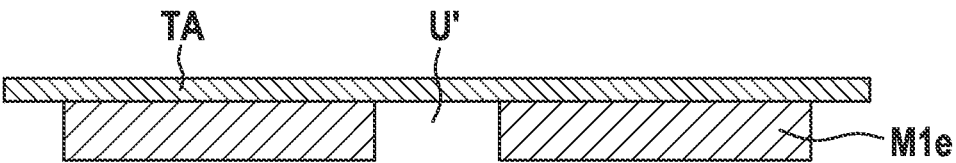

A tape TA is subsequently applied to the front face of the MEMS wafer M1e, and the latter is background according to FIG. 6C on the rear face so that the MEMS sensor devices on the tape TA are separated by the now continuous circumferential trenches U'.

Figure 6D:
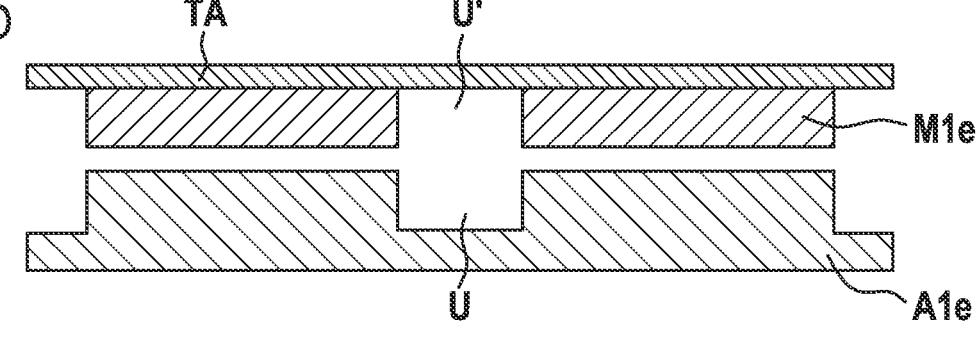
Figures 6E, 6F, 6G, 6H:
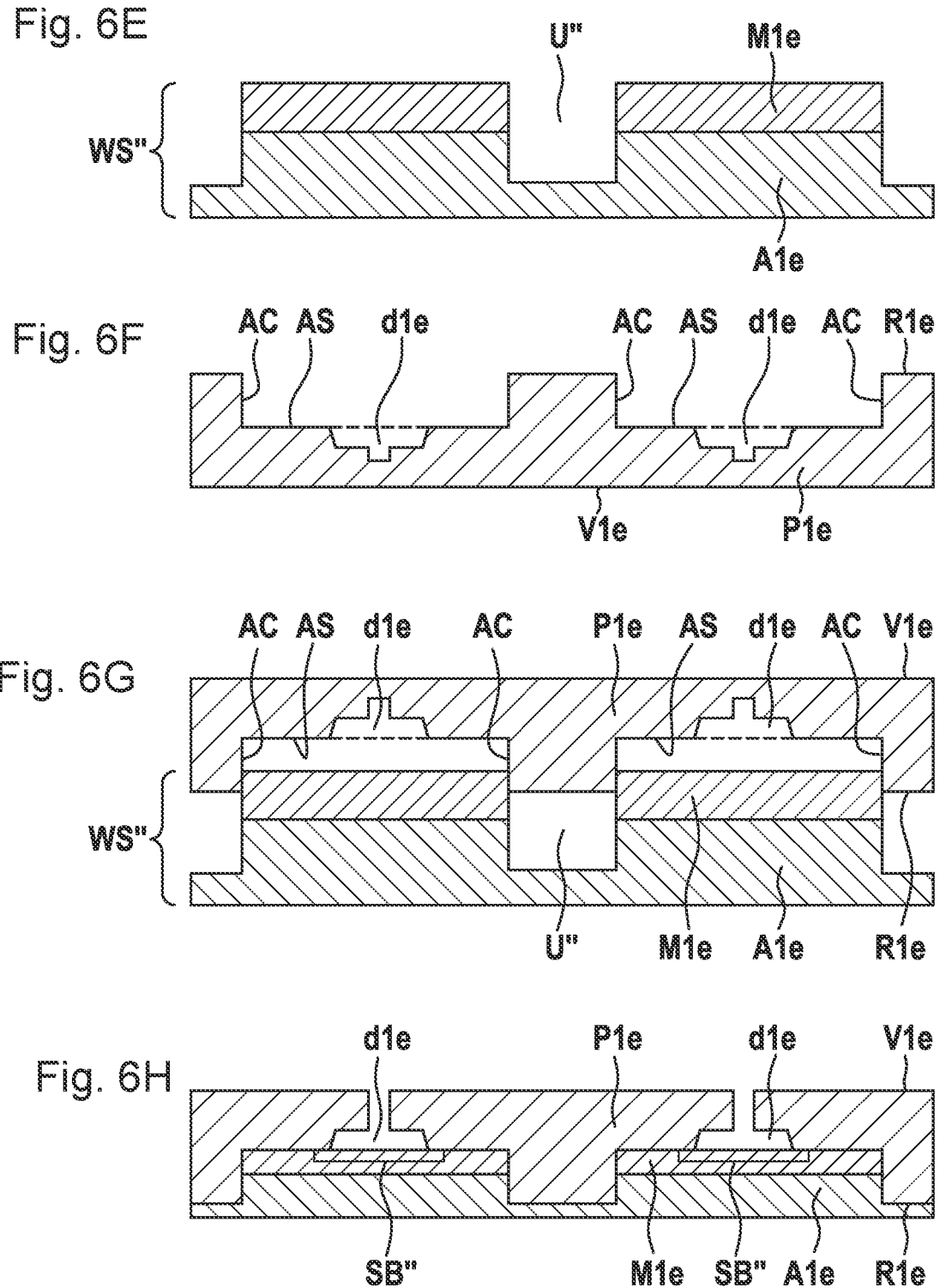

According to FIG. 6D, the MEMS wafer M1e is then bonded to the ASIC wafer A1e such that a MEMS sensor device is in each case bonded to an associated ASIC switching device, wherein the first and second circumferential trenches U, U' now form continuous trenches U", as shown in FIG. 6E.

The representation according to FIG. 6E results after removal of the tape TA and now shows a wafer stack WS" with trenches U", which surround the micromechanical sensor apparatuses at the wafer stack level at their lateral periphery and which extend completely through the MEMS wafer M1e and partially through the ASIC wafer A1e.

According to FIG. 6F, a first packaging wafer P1e is provided from a glass material or a glass ceramic material or a ceramic material and has a first front face V1e and a first rear face R1e.

A plurality of blind holes d1e are formed in the first rear face R1e and are provided on the first rear face R1e of the first packaging wafer P1e in a respective lowered region AS on the rear face R1E thereof. The lowered regions AS are designed such that their lateral periphery AC can enclose the lateral periphery of the micromechanical sensor apparatuses within the trenches U".

According to FIG. 6G, the first rear face R1e of the first packaging wafer P1e is then bonded to the wafer stack WS", wherein the blind holes d1e are in fluid connection with a respective sensor detection region SB" of the sensor devices.

According to FIG. 6H, the first front face P1e is then backthinned so that the blind holes d1e are exposed on the first front face V1e and the sensor detection regions SB" are thus in fluid connection with the outside through the blind holes d1e.

Furthermore, with respect to FIG. 6I, the ASIC wafer A1e is backthinned so that the ASIC wafer A1e and the first rear face R1e of the first packaging wafer P1e lie in one plane. Subsequently, separation takes place along the saw lines SL" in order to form sensor chip stacks C1e.

These sensor chip stacks C1e are laterally completely surrounded by the first packaging chip P1e', whereby the sensor chip stacks C1e consisting of the ASIC chip A1e', MEMS chip M1e' and the first packaging chip P1e' are protected from environmental influences all around.

FIG. 7 shows a schematic cross-sectional view for explaining a micromechanical sensor apparatus according to a seventh embodiment of the present invention.

In the seventh embodiment, in contrast to the fifth embodiment described above, a second packaging wafer P2e made of pyrex glass and having a second front face V2e and a second rear face R2e is bonded on the rear face to the wafer stack WS" after the process step according to FIG. 6I, so that the individual micromechanical sensor devices are now packaged on all sides. Again, separation takes place along the saw lines SL".

Otherwise, the seventh embodiment corresponds to the sixth embodiment described above.

Although the present invention has been described with reference to preferred exemplary embodiments, it is not limited thereto. In particular, the materials and topologies mentioned are only exemplary and not limited to the examples explained.

Although the above embodiments have been explained with reference to micromechanical pressure sensor apparatuses, the present invention can also be used for other micromechanical sensor apparatuses requiring fluid access.

In general, all glass materials or glass ceramic materials or ceramic materials that are correspondingly thermally adapted to the material of the MEMS and ASIC wafers can also be used.

What is claimed is:

1. A production method for a micromechanical sensor apparatus, comprising the following steps:

providing a bonded wafer stack including an ASIC wafer and a MEMS wafer bonded to the ASIC wafer, wherein the ASIC wafer includes a plurality of ASIC switching devices and the MEMS wafer includes a plurality of MEMS sensor devices, wherein each ASIC switching device and a corresponding MEMS sensor device are arranged one above the other such that they together form a respective micromechanical sensor apparatus in the bonded wafer stack;

providing a first packaging wafer made of a glass material or a glass ceramic material or a ceramic material, the first packaging wafer having a first front face and a first rear face, wherein in the first rear face, the first packaging wafer has a plurality of blind holes which are each assigned to a corresponding sensor detection region of a respective one of the MEMS sensor devices in the bonded wafer stack;

bonding the first rear face of the first packaging wafer to the wafer stack such that the blind holes are each in fluid connection with the corresponding sensor detection region of the MEMS sensor device;

backthinning, on the first front face, the first packaging wafer bonded to the wafer stack to expose the blind holes on the first front face so that the sensor detection regions of the MEMS sensor devices in the bonded wafer stack are in fluid connection with outside through the exposed blind holes; and separating the micromechanical sensor apparatuses in the bonded wafer stack into a plurality of sensor chip stacks each with a respective one of the micromechanical sensor apparatuses.

2. The production method according to claim 1, further comprising the following steps:

providing a second packaging wafer made of a glass material or a glass ceramic material or a ceramic material, the second packaging wafer having a second front face and a second rear face; and bonding the second front face of the second packaging wafer to the wafer stack on a side of the wafer stack opposite to the first packaging wafer.

3. The production method according to claim 2, wherein the first packaging wafer is bonded to the ASIC wafer, and wherein the ASIC wafer has a plurality of through-holes, which are each in fluid connection with a respective one of the sensor detection regions of one of the micromechanical sensor apparatuses.

4. The production method according to claim 3, wherein the MEMS wafer has a plurality of continuous first recesses, which are each adjacent to a respective first electrical contact of the ASIC wafer, wherein in the second front face, the second packaging wafer has a corresponding plurality of discontinuous second recesses, which are bonded to the first recesses, wherein backthinning of the second packaging wafer bonded to the wafer stack takes place on the second rear face to expose the first and second recesses on the second rear face so that the first electrical contacts are exposed toward the outside and each form an external electrical connection region of one of the micromechanical sensor apparatuses.

5. The production method according to claim 2, wherein the first packaging wafer is bonded to the MEMS wafer, wherein the MEMS wafer has a plurality of continuous third recesses, which are each adjacent to a respective second electrical contact in the ASIC wafer, wherein in the first front face, the first packaging wafer has a corresponding plurality of discontinuous fourth recesses, which are bonded to the third recesses, wherein, during backthinning of the first packaging wafer bonded to the wafer stack, the third and fourth recesses are exposed on the first front face so that the second electrical contacts are exposed toward the outside and each forms an external electrical connection region of one of the micromechanical sensor apparatuses.

6. The production method according to claim 1, wherein the wafer stack includes trenches, which at least partially surround the micromechanical sensor apparatuses at a wafer level at a lateral periphery and which extend completely through the MEMS wafer and partially through the ASIC wafer, wherein each of the blind holes are provided on the first rear face of the first packaging wafer in a respective lowered region of the first rear face, wherein the lowered regions are configured to enclose the lateral periphery of the micromechanical sensor apparatuses in a bonded state within the trenches.

7. The production method according to claim 2, wherein bonding of the first packaging wafer and/or bonding of the second packaging wafer is carried out by anodic bonding at most at about 300° C.

8. The production method according to claim 2, wherein material of the first packaging wafer and/or material of the second packaging wafer is pyrex glass or low-temperature co-fired ceramic material.

9. The production method according to claim 2, wherein the first packaging wafer and/or the second packaging wafer includes one or more vias for electrically contacting the micromechanical sensor apparatuses.

10. A micromechanical sensor apparatus, comprising:

a sensor chip stack including an ASIC chip and a MEMS chip bonded to the ASIC chip, and a first packaging chip, wherein the ASIC chip includes an ASIC switching device and the MEMS chip includes a MEMS sensor device, and wherein the first packaging chip is bonded to the ASIC chip or the MEMS chip;

wherein the first packaging chip is formed from a glass material or a glass ceramic material or a ceramic material; and wherein the first packaging chip has a through-hole through which a sensor detection region of the MEMS sensor device of the MEMS chip is in fluid connection with outside the micromechanical sensor apparatus.

11. The micromechanical sensor apparatus according to claim 10, wherein a second packaging chip made of a glass material or a glass ceramic material or a ceramic material is bonded to the sensor chip stack on a side of the sensor chip stack opposite to the first packaging chip.

12. The micromechanical sensor apparatus according to claim 10, wherein the first packaging chip is bonded to the ASIC chip, and wherein the ASIC chip has a through-hole which is in fluid connection with the sensor detection region of the micromechanical sensor apparatus.

13. The micromechanical sensor apparatus according to claim 11, wherein the MEMS chip has a continuous first recess, which is adjacent to a first electrical contact of the ASIC chip, wherein the second packaging chip has a corresponding continuous second recess so that the first electrical contact is exposed toward the outside and forms an external electrical connection region of the micromechanical sensor apparatus.

14. The micromechanical sensor apparatus according to claim 11, wherein the MEMS chip has a continuous third recess which is adjacent to a second electrical contact in the ASIC chip, wherein the first packaging chip has a corresponding continuous fourth recess so that the second electrical contact is exposed toward the outside and forms an external electrical connection region of the micromechanical sensor apparatus.

15. The micromechanical sensor apparatus according to claim 10, wherein the through-hole is provided in a lowered region, which encloses a lateral periphery of the ASIC chip and of the MEMS chip.

* * * * *